United States Patent [19]
Huott et al.

[11] Patent Number: 5,420,467
[45] Date of Patent: May 30, 1995

[54] PROGRAMMABLE DELAY CLOCK CHOPPER/STRETCHER WITH FAST RECOVERY

[75] Inventors: William V. Huott, Wappingers Falls; Timothy G. McNamara, Fishkill, both of N.Y.

[73] Assignee: International Business Machines Corporation, Armonk, N.Y.

[21] Appl. No.: 830,217

[22] Filed: Jan. 31, 1992

[51] Int. Cl.⁶ .................... H03K 5/01; H03K 5/13; H03K 17/56; H03K 5/159
[52] U.S. Cl. .................... 327/174; 327/172; 327/124; 327/392; 327/277; 327/294
[58] Field of Search .................... 328/55, 58, 66; 307/595, 597, 602, 603, 606, 265, 269, 240, 268

[56] References Cited

U.S. PATENT DOCUMENTS

| | | | |
|---|---|---|---|
| 3,831,098 | 8/1974 | Fletcher et al. | 328/58 |
| 4,016,511 | 4/1977 | Ramsey et al. | 333/29 |
| 4,458,165 | 7/1984 | Jackson | 307/603 |
| 4,626,716 | 12/1986 | Miki | 307/595 |
| 4,636,735 | 1/1987 | Wargo | 328/58 |
| 4,641,048 | 2/1987 | Pollock | 307/595 |
| 4,691,330 | 9/1987 | Takahashi et al. | 377/39 |
| 4,700,084 | 10/1987 | Honaker | 307/269 |
| 4,710,653 | 12/1987 | Yee | 307/269 |
| 4,719,365 | 1/1988 | Misono | 307/269 |
| 4,745,310 | 5/1988 | Swapp | 307/603 |
| 4,754,164 | 6/1988 | Flora et al. | 307/269 |
| 4,797,585 | 1/1989 | Segawa et al. | 307/606 |
| 4,820,943 | 4/1989 | Makino et al. | 307/603 |
| 4,825,103 | 4/1989 | Hornak | 307/353 |
| 4,845,390 | 7/1989 | Chan | 307/602 |
| 4,866,314 | 9/1989 | Traa | 307/603 |
| 4,922,141 | 5/1990 | Lofgren et al. | 307/595 |
| 5,065,041 | 11/1991 | Moles | 307/595 |
| 5,124,573 | 6/1992 | Wong | 307/291 |
| 5,172,010 | 12/1992 | Montegari | 307/269 |

OTHER PUBLICATIONS

Bartee, "Digital Computer Fundamentals", 1966, pp. 108–109, McGraw-Hill Book Company.
"IBM Technical Disclosrue Bulletin", vol. 27, No. 10A, Mar., 1985, pp. 5798–5799.
IBM Technical Disclosure Bulletin, vol. 31, No. 4, Sep., 1988, pp. 313–315.

Primary Examiner—Timothy P. Callahan
Assistant Examiner—Trong Phan
Attorney, Agent, or Firm—Whitham, Curtis, Whitham & McGinn; Charles W. Peterson, Jr.

[57] ABSTRACT

A pulse shaping circuit of the clock stretcher/chopper type which is sufficiently simplified to be included on an integrated circuit chip with other circuits without significantly reducing the chip area on which such other circuits may be formed achieves a fast recovery time by developing differential delays in response to each of two different characteristics of a signal input to a delay line. Pulse stretching is accomplished by a latch circuit and pulse chopping is accomplished by a delay arrangement which controls the latching action and the output signal. The delay arrangement may also be made programmable. By controlling the latching and the output signal in response to the delay line, a wide range of duty cycles of input and output signals may be accommodated, even at extremely high frequencies. By providing for asymmetric delays, preferably by an asymmetric logic gate monitoring selected stages of a multi-stage delay line, the recovery period of the circuit is made independent of the total delay of the delay line.

17 Claims, 4 Drawing Sheets

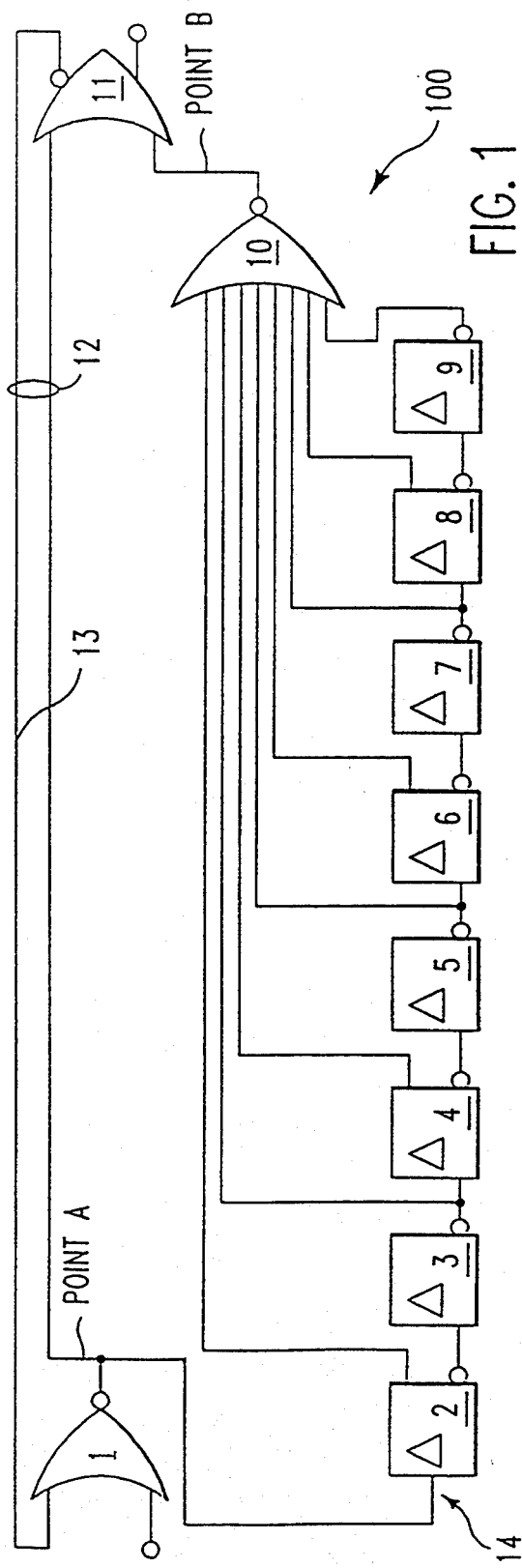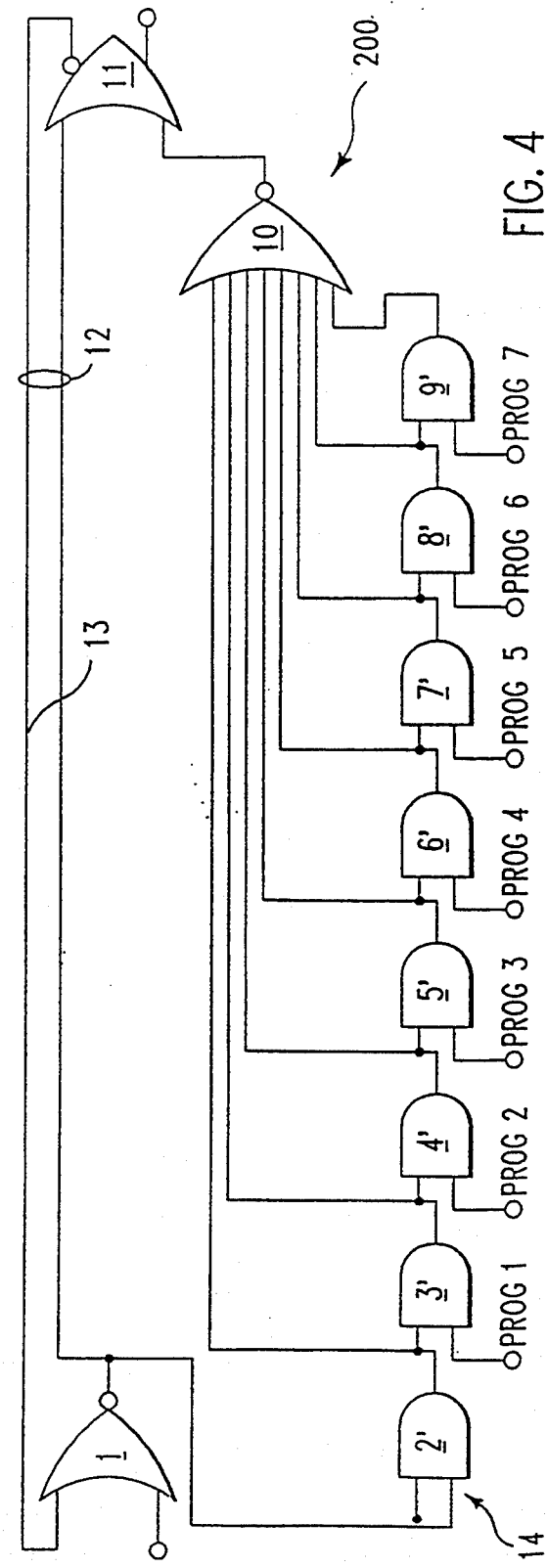

PROGRAMMABLE DELAY CLOCK CHOPPER/STRETCHER WITH FAST RECOVERY

BACKGROUND OF THE INVENTION

1. Field of the Invention

The present invention generally relates to pulse shaping circuits and, more particularly, to clock pulse stretcher/chopper circuits which output pulses of a predetermined pulse width in a manner largely independent of input pulse width.

2. Description of the Prior Art

The information contained in the binary state of any signal in a digital circuit is often a function of the particular time at which a particular binary state exists or changes. Therefore, in the field of digital circuit design, the inherent and unavoidable propagation delay of a signal through any element of a digital circuit, including simple metal connections thereof, must often be considered. For this reason, most digital circuits include arrangements for synchronizing operations for the purpose of establishing a time at which signals are to be sampled or operations performed in regard to signals then existing at inputs to certain circuit elements. It is therefore common to provide one or more clocks, possibly of differing phases, for control of the timing of operation of most digital circuits. Such a clock is also useful in the reshaping of digital signals both as to amplitude and duration as such digital signals are propagated through a digital circuit.

It is, of course, a complicating factor in the design of digital circuits that clock signals are also subject to propagation delays and other forms of distortion as they are distributed to various elements of a digital circuit and circuits for reshaping clock signals are well-known. In particular, the duration of a pulse of a clock signal may be critical to the operation of a particular digital circuit or one or more portions thereof. Accordingly, a type of circuit known as a pulse stretcher/chopper has been developed to produce a pulse of predetermined duration in response to a particular event such as the change of state of a particular signal in the system, such as a clock signal.

One known type of circuit used for this purpose is the so-called relaxation oscillator or monostable flip-flop which uses a circuit with a time constant, such as an RC circuit, to determine the output pulse duration. The same effect can be achieved with a logic circuit such as an EXCLUSIVE-OR or AND gate by using a similar time constant circuit to introduce a delay or phase shift between inputs thereto of a common signal.

Further, the recovery period (e.g. the period between completion of an operation in response to an input event and the time the circuit becomes able to respond to another input event) for such circuits after the termination of an output pulse is often excessively long for use with high-speed digital circuits or where extreme duty cycles of input or output signals are involved. Since the recovery period of the circuit must ordinarily be matched by the duration of an inactive state of the input signal and/or the pulse shaping circuit, itself, the required recovery period not only limits the frequency at which the clock stretcher/chopper can operate but also establishes limits on operating margins which must be provided with respect to the duty-cycle of both the input and output of the pulse stretcher/chopper.

The problem of recovery time has generally not been solved without resort to circuits of substantial complexity. Without complex fast recovery circuitry, the recovery time often approximates one half of the clock cycle time. If the duration of the inactive (e.g. binary 0) period of the input clock pulse is shorter than the delay provided to establish output pulse duration of the pulse stretcher/chopper circuit, glitching or the production of pulses of incorrect duration is very likely to occur. As computing circuitry has been designed to operate at higher clock rates and reduced cycle times, accommodating duty-cycle restrictions on the system clock consistent with noise immunity and dedicating sufficient chip space to complex, high-performance clock stretcher/choppers have both become prohibitive.

Another problem associated with pulse shaping circuits is the fact that the output signal is less than fully controlled by the input signal. This is inherent due to the function of reshaping of the pulse, particularly as to duration. In other words, once an "event" appears to have been detected, if any discrimination is provided at all, the output of the pulse shaping circuit will be determined by the parameters of the pulse shaping circuit rather than the input signal. Since an "event" is usually detected as the leading edge of a pulse, such circuits are often susceptible to being triggered by noise signals or small voltage spikes occurring in the system. Since digital circuits usually operate to develop rapid transitions in voltage between binary logic states, a tendency to develop such noise signals is also inherently present. Therefore, unless relatively sophisticated noise rejection or pulse width discrimination circuitry is employed, spurious operation of the pulse shaping circuit may occur.

An example of a pulse shaping circuit including pulse width discrimination circuitry is disclosed in U.S. Pat. No. 4,636,735 to R. A. Wargo in which signals of less than a predetermined duration are propagated without increasing the pulse length, but with a substantial delay. Pulses of greater than a predetermined duration are stretched by a predetermined amount. However, this circuit is not capable of producing an output pulse of a specific, predetermined duration. That is, if the input pulse is longer than a predetermined duration, the output pulse will be of the duration of the input signal but increased by a predetermined duration.

Due to the complexity of digital circuits at the present time, it is becoming more desirable to provide pulse reshaping circuits such as clock stretcher/choppers on each chip which includes clocked logic or must perform accurately timed operations. An example of such an implementation is shown in U.S. Pat. No. 4,754,164, to L. P. Flora et al. which utilizes a relatively large strip delay line on the chip to achieve de-skewing of a clock signal. For this reason, the complexity of such circuits or size of the components thereof, as in the Flora et al. patent, which has been required to achieve adequate noise immunity and fast recovery time has recently become more objectionable since the footprint of such a circuit commonly limits the portion of the surface of the chip on which the remainder of the chip circuitry can be formed.

SUMMARY OF THE INVENTION

It is therefore an object of the present invention to provide a simplified circuit capable of performing input pulse width discrimination, outputting a signal of predetermined duration in response to an input event and having fast recovery to accommodate a wide range of input signal duty-cycles.

It is another object of the invention to provide a simplified circuit capable of performing input pulse width discrimination, outputting a signal of programmable duration in response to an input event and having fast recovery to accommodate a wide range of input signal duty cycles.

It is a further object of the invention to provide a clock stretcher/chopper circuit which may be included on a chip with other digital circuitry without significantly limiting the amount of the chip which may be used to form the digital circuitry.

In order to accomplish the above and other objects of the invention, a pulse shaping circuit is provided including a circuit for receiving an input signal and a reset circuit for controlling an output of the pulse shaping circuit including differential delay arrangement, wherein the reset circuit provides a first output signal after a first predetermined delay in response to a first predetermined characteristic of an input signal and a second output signal after a second predetermined delay in response to a second predetermined characteristic of. an input signal.

In accordance with a further aspect of the invention, a pulse shaping circuit is provided including a circuit for latching an input signal having a duration greater than a predetermined duration, a circuit for interrupting the latching function, a multi-stage delay line, a circuit for monitoring a signal at at least two stages of the multi-stage delay line to produce a first predetermined signal in response to a first logical signal appearing at a selected plurality of stages of the multi-stage delay line and a second predetermined signal in response to a second logical signal appearing at at least one stage of the multi-stage delay line, wherein the circuit for interrupting the latching function of the latching circuit is enabled in response to said first predetermined signal and disabled by said second predetermined signal.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a schematic diagram of a pulse stretcher/chopper in accordance with the present invention, FIG. 4 is an alternative embodiment of the invention in which the output pulse width is programmable.

DETAILED DESCRIPTION OF A PREFERRED EMBODIMENT OF THE INVENTION

Figure 1A:
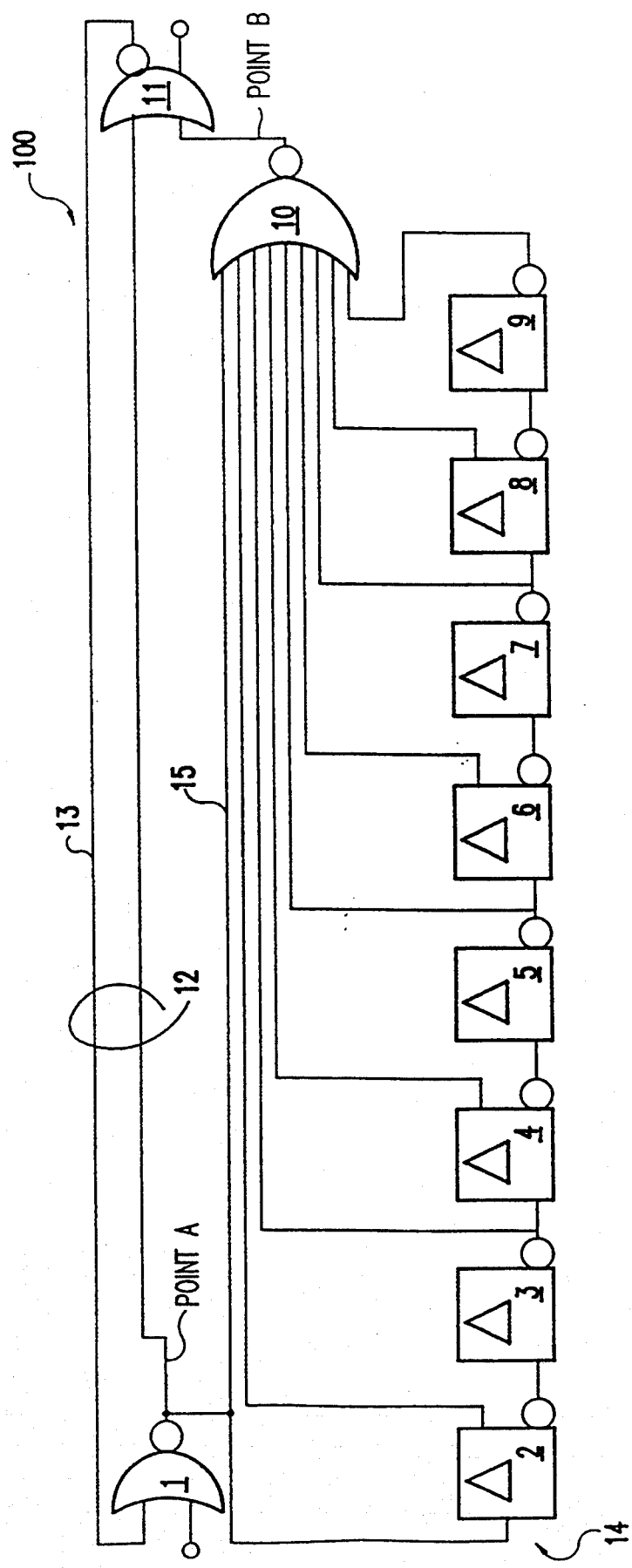
FIG. 1A is a variation of the invention shown in FIG. 1.

Referring now to the drawings, and more particularly to FIG. 1, there is shown, in schematic form, the organization of the pulse stretcher/chopper circuit in accordance with an embodiment of the invention. The circuit of FIG. 1 essentially comprises only three OR gates 1, 10, 11 and a multi-stage delay line having, for example, stages 2, 3, 4, 5, 6, 7, 8 and 9. These stages may be comprised of virtually any circuit element such as a transistor having a finite signal propagation time and, at least for purposes of this embodiment, capable of producing true and complement outputs (as would be available at the respective conduction terminals of such a transistor). The delay line does not require a large number of stages and, in fact, might be reduced to, say, two stages at extreme clock frequencies. Even reduction to a single stage would remain operable. However, certain advantages of the invention, such as the ability to accommodate an extremely wide range of duty cycle of an input and/or output signal, which are developed in the circuit according to the invention by obtaining maximum and minimum delays from the delay line would be diminished if only a single delay stage were provided. On the other hand, as will become clear from the following description of the invention, the meritorious effects of the invention can be fully maintained as long as differential delays may be obtained from the delay line for different features or characteristics of an input signal such as positive- and negative-going signal transitions.

It is to be understood that multiple stages of the delay line are shown in FIG. 1 in order to provide a more complete and generalized understanding of the invention and to facilitate an understanding of the programmable embodiment of FIG. 4 in which multiple stages are, in fact, necessary for the purpose of producing different delays and output pulse durations. Also, for purposes of clarity, the circuit of FIG. 1 will be described without the inclusion of connection 15, shown in FIG. 1A as a variation of the invention, described below. Likewise, the timing diagrams of FIGS. 2 and 3 refer to the circuit of FIG. 1 without the inclusion of connection 15.

As a matter of design of the circuit of FIG. 1, the total delay of the delay line must be at least slightly less than the clock cycle to be input and, as will be discussed in more detail below, the minimum recovery time of the circuit is equal to the greater of the delay of stage 2 plus the propagation time of OR gate 10 or the delay of any one of delay stages 3–9. This constraint on minimum recovery time will be slightly altered if connection 15 is included, as will be noted below.

Conversely, it should be noted that the recovery time of circuit of FIG. 1 could be shortened by reduction of the propagation time of either delay stage 2 or OR gate 10, with the sole limitation that the inactive period of the input signal may not be less than the largest propagation time of the total propagation time of delay stage 2 and gate 10 or the propagation time of any single other stage in the multi-stage delay line (unless additional pulse stretching arrangements are employed which would increase the complexity of the circuit). The reason for this slight design limitation is that any logical 1 available at a point on the delay line, such as an input (e.g. connection 15) or the output of stage 2, must not return to a logical 0 before the logical 1 can propagate through the next stage. Therefore, it is desirable for the purpose of obtaining fast recovery speed that multiple stages be provided in the delay line and that the delay of each stage be very short. Additionally, to provide fast recovery, the delay of stage 2 can be reduced below that of the longest delay of any other single stage of the delay line by the propagation time of OR gate 10.

The OR gates can be fabricated according to any technology (e.g. bipolar, CMOS, etc.) and whatever design rules are to be followed in the formation of whatever other digital circuitry is to be placed on the chip, if any. It is important that the OR gates be designed to have an inverting output or other signal inversion or complementing circuitry provided. However, it is to be noted that in CMOS and some other technologies, a minimized element count of a gate generally corresponds to an inverting or complement output and further elements must be provided in order to obtain a non-inverting or so-called true output.

Essentially, the circuit of FIG. 1 has two signal paths which may broadly be considered as a pulse stretcher path 12 preferably including feedback loop 13 and a reset or chopper path 14 including the delay line including stages 2-9, hereinafter collectively referred to as delay line 2-9, and OR gate 10. The pulse stretcher path 12 may include a cross-coupling of inputs and inverting outputs of OR gates 1 and 11 to provide a latch. Thus, when an oscillator or clock input goes from an inactive (e.g. 0) state to an active (e.g. 1) state, the inverting output of OR gate 1, Point A, goes from 1 to 0 and the inverting output of OR gate 11, having the same binary state as the input signal, is fed back over connection 13 to latch the output state of OR gate 1. The output state of OR gate 1 will thus be maintained until interrupted, regardless of the binary state of the input signal once latching occurs.

It is important to recognize that each of OR gates 1 and 11 has a finite signal propagation time. Therefore, the latching action requires that the binary state of the input signal be maintained for at least the sum of the propagation times of these two OR gates. If not, latching of the gates cannot occur. This causes the circuit to inherently provide a substantial degree of noise immunity and input pulse width discrimination. If desired, the propagation time of either or both of OR gates 1 and 11 could be adjusted by the addition of resistance or capacitance to these circuits or in other ways well-understood in the art. However, in practice, such adjustment of propagation time has not been found necessary since a duration of twice the propagation time of a single gate (which would be comparable to the propagation times of other gates on the chip) is normally greater than the duration of noise pulses (e.g. other than for so-called coupled noise) or the variation in propagation times of such other gates on the chip.

It is also important to understand that the feedback path 13 need only be provided to latch the input signal if a pulse stretching function is to be provided. If, for instance, the duration of the input signal will unconditionally exceed the duration of the output signal, latching of the input signal will be essentially irrelevant to the operation of the invention, as will become clear from the discussion of FIG. 3, below. In other words, if only a pulse chopping function is required from the circuit, it is only necessary to provide some input means capable of receiving an input signal and gating the input signal in response to a signal developed in response to the input signal by the reset or chopper path 14, in accordance with the invention.

The principal function of the reset or chopper path 14 is to allow control of the circuit output and, if necessary, interruption of the input signal or the latching thereof due to the above-described cross-coupling of inverting outputs of OR gates 1 and 11. These functions will be accomplished when a binary 1 signal is provided to an input of OR gate 11 from the inverting output of OR gate 10 after a suitable delay generated by the multistage delay line 2-9. To understand the operation of this output control and interruption function, first consider the initial conditions of the entire circuit prior to an active (e.g. binary 1 valued) portion of an input clock pulse. The input to the circuit will, of course, be a binary 0 and Point A will have a value of binary 1 because of the inverting output of OR gate 1. The binary 1 value at point A will have propagated through the multi-stage delay line 2-9 (or at least a portion thereof) and all (or at least some) of the inputs to OR gate 10 will be of binary value 1, causing a binary 0 to be output to an input of OR gate 11.

As an aside, it is considered somewhat preferable to invert the signal at each stage of the delay line as a matter of minimization of the element count and footprint of each of the stages in some integrated circuit technologies, such as CMOS. Therefore, true outputs (which generally require at least one additional transistor) need only be provided on alternate stages of the delay line. It should also be noted that the same effect could be achieved by providing inverting inputs on OR gate 10. However, it is immaterial to the invention or to the footprint occupied by the circuit according to the invention where the signal inverting structure is or is considered to be located. Inversion of alternate stages is also desirable in some technologies such as emitter coupled logic (ECL) to reduce variation in delay time due to power supply variation by using the complementary conduction states of alternate stages to balance the electrical load presented by respective groups of delay line stages.

When an active portion (e.g. binary 1) of an input clock signal is received by the circuit of FIG. 1, Point A goes to binary 0 and the inverting output of OR gate 11 goes to binary 1 to latch OR gates 1 and 11 as described before. At the same time, a binary 0 is applied to the input of the multi-stage delay line 2-9. As this binary 0 is propagated through each consecutive stage of the delay line, an output (either true or complement) of each stage goes to binary 0 and these outputs are applied to respective inputs of OR gate 10. The output of inverting OR gate 10 will remain a binary 0 as long as any input remains a binary 1. However, when the binary 0 has propagated through the entirety of the multistage delay line, all inputs to OR gate 10 will, in fact, be binary 0, forcing Point B to a binary 1 and, in turn forcing the inverting output of OR gate 11 to binary 0 to interrupt the latching action of OR gates 1 and 11 as described above. The true output of OR gate 11 will, of course, be simultaneously forced to binary 1 to reflect the end of the predetermined duration of the stretched or chopped pulse, the duration of which has thus been established by the total delay of the delay line 2-9 and the propagation time of OR gate 10. The duration of the output pulse is thus precisely determined by the propagation time from Point A to Point B regardless of which of the stretching and chopping functions is being performed since the output of gate 11 is directly controlled by the output of OR gate 10.

It is important to understand that if the input to the circuit is binary 0 when the inverting output of OR gate 11 is also forced to binary 0, a binary 1 will appear at Point A and be propagated through the delay line 2-9. It is also important to understand that recovery of the circuit will be complete and the circuit readied to respond to another input binary 1 as soon as Point B can be returned to a binary 0 value. This will occur in response to a binary 1 being applied to any input of OR gate 10 for a period not less than the maximum of the propagation times of any stage of the delay line or the total propagation time of stage 2 and OR gate 10. For this reason, in extremely high speed operation and to obtain the widest possible operating margins, it may be desirable to arrange for the propagation delay of stage 2 to be shorter than that of other stages of the delay line by as much as the propagation time of OR gate 10.

It should also be noted that the logical asymmetry which is characteristic of OR gate 10 (and some other types of logic which would be appropriate to the practice of the invention) allows the reset or chopper path 14 to develop differential delays in response to different characteristics of the input signal. Thus, in the embodiment illustrated in FIG. 1, a binary 0 must propagate through the entirety of the delay line before controlling the chopping or stretching action of the circuit while the complementary signal state need only propagate through delay stage 2 and OR gate 10 for recovery of the circuit. In fact, the recovery of the circuit may be made responsive to an input of the delay line by the provision of the connection shown by dashed line 15 in FIG. 1, although the signal would, nevertheless, propagate through the delay line ahead of any subsequent signal developed in response to the input of the circuit returning to an active state.

Figure 2:
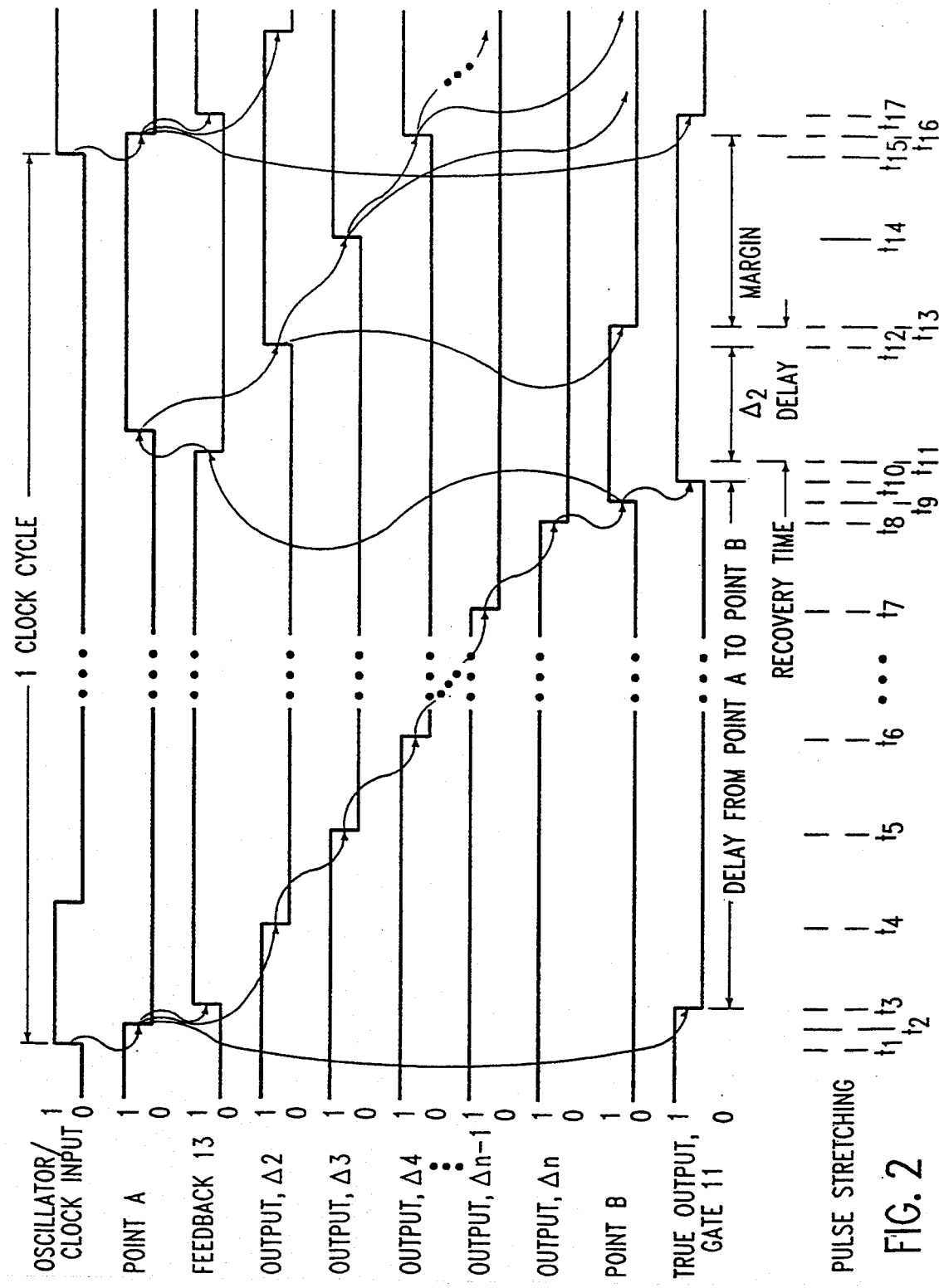
FIG. 2 is a timing diagram illustrating the operation of the circuit of FIG. 1 to stretch a pulse which is input to the circuit.
Figure 3:
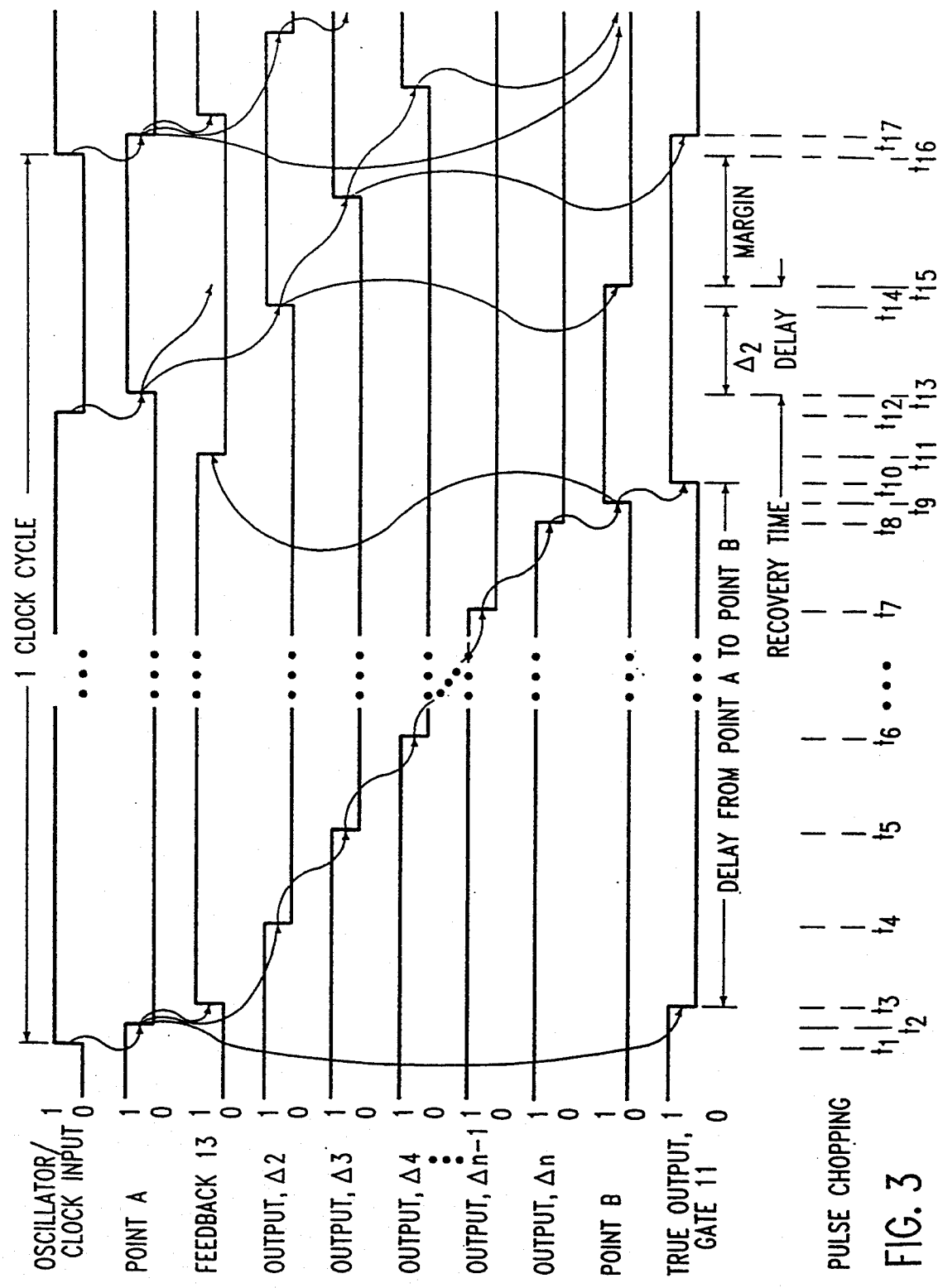
FIG. 3 is a timing diagram illustrating the operation of the circuit of FIG. 1 to chop or shorten a pulse which is input to the circuit.

To assure a complete understanding of the operation of the invention and how wide operating margins with regard to input signal duty cycles are achieved, the operation of the circuit of FIG. 1 will be reviewed in detail with reference to the signal waveforms shown in FIGS. 2 and 3. It is to be understood, however, for purposes of clarity, the outputs of delay stages 2–9 are all shown in the same logical sense in FIGS. 2 and 3, as seen at the inputs to OR gate 10. Also, since the number of stages in the delay line is essentially arbitrary within the design considerations outlined above, the last two stages of the delay line will be referred to as n-1 and n, respectively. Further, for purposes of clarity, the delay of all delay stages is indicated by the same time duration and the propagation time of each of the OR gates 1, 10 and 11 (e.g. a block delay) is indicated as being approximately ¼ of the delay of a single delay stage. However, it is to be understood that none of these conditions and relative delay durations are critical to the practice of the invention and, in practice, may differ substantially from the relative delays illustrated. In particular, as will be discussed in regard to FIG. 4, it may be advantageous to implement the invention entirely with logic gates in which the propagation time of each gate will be approximately the same.

FIG. 2, in particular, illustrates the operation of the circuit of FIG. 1 as a pulse stretcher. A short, positive-going input pulse is shown in the uppermost line of FIG. 2 and one clock cycle is indicated as extending from a leading edge of this pulse to the leading edge of the next such pulse. It should be noted that, as indicated above, the width of this pulse need only be greater than the sum of the propagation times of OR gates 1 and 11 (e.g. $t_1 - t_2$ and $t_2 - t_3$, respectively).

The propagation of the leading edge of the input pulse, occurring at $t_1$, to the output of gate 1 is shown at time $t_2$. Since the output of OR gate 1 is an inverting output, this appears as a negative-going transition which is applied to an input of OR gate 11. In response, as shown by two of the curved arrows from the negative-going transition of the signal at Point A, after a further signal propagation time, $t_2 - t_3$, a positive-going signal transition appears at the inverting output of OR gate 11 and a negative-going transition appears at the "true" output of OR gate 11.

The output of OR gate 1 is also supplied to the input of delay stage 2 at the beginning of the multi-stage delay line 2–9. After propagating through delay stage 2, a negative-going transition appears at the output of delay stage 2 at time $t_4$, as shown by the third curved arrow from the negative-going transition of the signal at Point A, and is applied to the input of delay stage 3 and an input to OR gate 10. The negative-going transition is thus propagated through delay stage 3 at time $t_5$ and each of the following stages of the delay line, in turn, at times such as $t_6$ and, eventually, at times $t_7$ and $t_8$. It is important to note that only a negative going transition is propagated through the delay line at this time, even though the input pulse terminates between times $t_4$ and $t_5$ due to the latching of cross-coupled OR gates 1 and 11. If the input pulse is to short for latching to occur, the pulse will propagate through gates 1 and 11, but will not be stretched. Such a short pulse will also be propagated through the delay line but will not be passed by OR gate 10 since at least one of the inputs thereto will be at or have returned to the binary 1 state at any time that propagation of the short pulse causes a binary 0 on any other particular input of OR gate 10.

When the negative-going transition has been propagated through all stages of the delay line 2–9, all inputs to OR gate 10 will be at binary 0 level and the inverting output will go positive at time $t_9$. This has two effects as shown by the two curved arrows from the positive-going transition in the waveform for Point B. Specifically, both the true and inverting outputs of OR gate 11 are forced to change state in response to a binary 1 from OR gate 10 at time $t_{10}$. This interrupts the latching of cross-coupled OR gates 1 and 11 by forcing the signal on feedback line 13 to binary 0 at time $t_{10}$ and, in response, a positive-going transition appears at Point A at time $t_{11}$ which is also propagated through respective stages of the delay line 2–9 at times such as $t_{12}$, $t_{14}$ and $t_{15}$.

However, in accordance with the invention, this positive-going transition need not be propagated through the entirety of the delay line 2–9 in order complete the recovery of the circuit. Specifically, at time $t_{12}$, a binary 1 from the output of delay stage 2 will be applied to an input of OR gate 10 which will force Point B to binary 0 at time $t_{13}$. Even if another input pulse is applied immediately subsequent to time $t_{13}$, a binary 1 state will propagate through each stage of the delay line 2–9 ahead of a negative-going transition and maintain point B at a binary 0 level until all inputs are simultaneously returned to binary 0, as before. This is illustrated in FIG. 2 by curved arrows from each of the positive-going transitions at $t_{12}$, $t_{14}$ and to the waveform for Point B, indicating that each positive, overlapping pulse output from each of the delay stages 2–9 contributes to maintaining point B at a binary 0 level. As indicated above, return of point B to the binary 0 level is sufficient to complete the recovery of the circuit at time $t_{13}$ and the circuit is thus prepared to respond to a further input pulse at any time thereafter. For reference and completeness, times indicated at $t_{15}$, $t_{16}$ and $t_{17}$ of the following clock cycle correspond to times $t_1$, $t_2$, and $t_3$.

In summary of FIG. 2, then, it is seen that the pulse stretching effect of the circuit according to the invention produces a pulse which has a width precisely corresponding to the delay from Point A to Point B (e.g. the delay of the delay line plus the propagation time of OR gate 10), plus or minus any difference in propagation time for rising and falling pulses of gate 11, and delayed from the input pulse leading edge by only the propagation time by the sum of propagation times of OR gates 1 and 11. The recovery time corresponds to the delay of delay stage 2 plus the propagation time of OR gate 10 or the maximum delay of any single stage of the delay line. Therefore, very high duty cycles of the output signal can be obtained from the invention and may even allow a substantial operating margin to exist, as shown, even at high frequencies.

FIG. 3 shows the pulse chopping function of the circuit according to the present invention which would be required if the duty cycle of the input signal was greater than the desired duration of the output signal. It should be noted that the duration of the output pulse available at either the true or inverting output of OR gate 11 is precisely the same as that to FIG. 2. The recovery time is also identical to that of FIG. 2 but occurs later in FIG. 3 since the positive-going transition of the waveform at Point A occurs subsequent to the completion of propagation of the negative-going transition to Point B through the delay line 2–9 and OR gate 10.

The operation of the circuit in accordance with FIG. 3 only differs from the operation depicted in FIG. 2 by the fact that while the output of OR gate 11 and the feedback signal on connection 13 are controlled by the output of OR gate 10 (e.g. the positive-going transition at Point B at time $t_9$ and propagated at OR gate 11 at time $t_{10}$), the binary state of Point A does not change at time $t_1$, as in FIG. 2, but is maintained by the input signal Until the negative-going transition thereof at time $t_{12}'$, propagated at time $t_{13}'$ by OR gate 1.

This change of binary state of Point A will be propagated through delay stage 2 at time $t_{14}'$ as described above and will cause a negative-going transition at Point B at time $t_{15}'$. At any time after time $t_{15}'$ a further input pulse can be accepted and until that time no latching signal will be fed back to OR gate 1 since Point A will be at a binary 1 level, forcing a binary 0 at the inverting output of OR gate 11.

Referring now to FIG. 4, a variation of the invention will now be explained. In the circuit schematically depicted in FIG. 4, OR gates 1, 10 and 11 and the connections therebetween and to the delay line are identical to the illustration of FIG. 1 and the reference numerals have, accordingly been retained. The mode of operation of the circuit of FIG. 1, as explained above allows a programmable delay to be easily obtained by the simple expedient of including some form of gating to force the outputs of a selected number of terminal stages to a binary 0 level such as by AND gates 2', 3', ... 8' and 9'. It should also be noted that the propagation delays of each of these AND gates will approximate the propagation of the OR gates 1, 10 and 11 and the minimum delay of the delay line, corresponding to the delay of AND gate 2' and the propagation time of OR gate 10 will correspond to the recovery time of the circuit. If AND gates are used, the input of a binary 0 to each of one or more gates of a terminal (e.g. one or more consecutive gates and the end of the delay line) group of gates such as PROG7, PROG6, PROG5, ... would effectively both reduce the number of stages in the delay line and remove potential inputs from OR gate 10. In particular, in the arrangement illustrated, application of a binary 0 to any one of AND gates 3'–9' (AND gate 2' should not ordinarily be removed from the delay line), will terminate propagation of either positive- or negative- going transitions through the delay line and will, hold the output of all subsequent AND gate at a binary 0, thus allowing selectable delays to be developed.

It is to be understood that while AND gates 2'–9' are considered preferable from a standpoint of circuit integration complexity and footprint size, many other logic arrangements could be provided including a direct gating of the inputs to OR gate 10 with any type or types of circuit constituting respective stages of the delay line. Similarly, the description of OR gates 1, 10 and 11 having inverting outputs should be considered as merely illustrative since many other types of logic circuit could actually be employed in the implementation of the invention; the principal functions being a technique of latching an input signal to allow pulse stretching and a delay for establishing the duration of the input latching and/or controlling the output of the circuit directly. Further, for fully exploiting the ability of the invention to provide a short recovery time and achieve large operating margins and the ability to function with either the input or the output having a high duty cycle, a different amount of delay should be provided for positive- and negative-going transitions propagated through the delay line whereby delay should be maximized or programmable for one and minimized for the other. In particular, connection 15 of FIG. 1 could also be provided in the circuit of FIG. 4 and would produce precisely the same effect and slight modification of recovery period as described with reference to the circuit of FIG. 1.

In summary, it will be evident to those skilled in the art that the invention provides a simplified circuit capable of performing input pulse width discrimination, outputting a signal of predetermined or programmable duration in response to an input event and having fast recovery to accommodate a wide range of input signal duty cycles and which is suitable for integration with other circuits while not being significantly limiting of chip space usable for such other circuits.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. A pulse shaping circuit including
   a means for receiving an input signal and providing a corresponding signal as an output of said pulse shaping circuit, and
   a reset means for controlling said output of said pulse shaping circuit including differential delay means having at least two digital circuit stages and means for logically combining signals appearing at respective ones of said at least two digital circuit stages, said reset means providing a first output signal after a first predetermined delay in response to a first predetermined characteristic of a signal which is input to said reset means and providing a second predetermined delay in response to a second predetermined characteristic of said signal which is input to said reset means, said second predetermined delay being significantly shorter than said first predetermined delay.

2. A pulse shaping circuit as recited in claim 1, wherein said means for receiving an input signal includes a latch means for latching said input signal and wherein said signal which is input to said reset means is a signal which is present in said latch means.

3. A pulse shaping circuit as recited in claim 2, wherein said latch means includes two cross-coupled logic gates.

4. A pulse shaping circuit as recited in claim 3, wherein at least one of said logic gates includes means for providing at least one of an inverting output and an inverting input for said logic gates.

5. A pulse shaping circuit as recited in claim 4, wherein at least one of said logic gates is an OR gate.

6. A pulse shaping circuit as recited in claim 1, wherein said reset means includes a logic gate and a multi-stage delay line having at least two delay stages, means for providing outputs of at least two stages of said multi-stage delay line as inputs to said logic gate,
said logic gate providing a first predetermined logical output when all inputs to said logic gate are of a first predetermined logical state and a second predetermined logical output when any input to said logic gate is of a second predetermined logical state.

7. A pulse shaping circuit as recited in claim 2, wherein said reset means includes a logic gate and a multi-stage delay line having at least two delay stages, wherein at least two stages of said multi-stage delay line provide outputs to said logic gate,
said logic gate providing a first predetermined logical output when all inputs to said logic gate are of a first predetermined logical state and a second predetermined logical output when any input to said logic gate is of a second predetermined logical state.

8. A pulse shaping circuit as recited in claim 6, wherein a first delay stage of said multi-stage delay line provides a delay which is shorter than at least one other stage of said multi-stage delay line.

9. A pulse shaping circuit as recited in claim 7, wherein a first delay stage of said multi-stage delay line provides a delay which is shorter than at least one other stage of said multi-stage delay line.

10. A pulse shaping circuit as recited in claim 6, further including means for providing a signal of said first predetermined logical state to at least one input of said logic gate.

11. A pulse shaping circuit as recited in claim 7, further including means for providing a signal of said first predetermined logical state to at least one input of said logic gate.

12. A pulse shaping circuit as recited in claim 11, wherein a first delay stage of said multistage delay line provides a delay which is shorter than at least one other stage of said multi-stage delay line.

13. A pulse shaping circuit as recited in claim 12, wherein a first delay stage of said multi-stage delay line provides a delay which is shorter than at least one other stage of said multi-stage delay line.

14. A pulse shaping circuit including
means for latching an input signal having a duration greater than a predetermined duration,
means for interrupting said latching function of said means for latching an input signal,
a multi-stage delay line,
means for monitoring a signal at at least two stages of said multi-stage delay line to produce a first predetermined signal in response to a first logical signal appearing at a selected plurality of stages of said multi-stage delay line and a second predetermined signal in response to a second logical signal appearing at at least one of said selected plurality of stages of said multi-stage delay line,
said means for interrupting said latching function of said means for latching an input signal being enabled in response to said first predetermined signal and disabled by said second predetermined signal.

15. A pulse shaping circuit as recited in claim 14, further including means for selectively forcing an output of at least one stage of said multi-stage delay line to a predetermined logical state.

16. A pulse shaping circuit as recited in claim 14, further including means for terminating propagation of a signal through said multi-stage delay line at a selected stage of said multi-stage delay line.

17. A pulse shaping circuit as recited in claim 14, further including means for forcing at least one input of said means for monitoring a signal at at least two stages of said multi-stage delay line to a predetermined logical state.

* * * * *